(12) United States Patent
Endo et al.

(10) Patent No.: US 8,017,684 B2
(45) Date of Patent: Sep. 13, 2011

(54) HEAT CONDUCTIVE SILICONE GREASE COMPOSITIONS

(75) Inventors: Akihiro Endo, Annaka (JP); Kei Miyoshi, Annaka (JP); Kunihiro Yamada, Takasaki (JP); Hiroaki Kizaki, Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 414 days.

(21) Appl. No.: 11/616,185

(22) Filed: Dec. 26, 2006

(65) Prior Publication Data

US 2007/0149834 A1 Jun. 28, 2007

(30) Foreign Application Priority Data

Dec. 27, 2005 (JP) .................. 2005-374486

(51) Int. Cl.
 *A23J 7/00* (2006.01)
 *C10L 1/16* (2006.01)
(52) U.S. Cl. ............ 524/588; 585/7; 508/150; 508/154; 508/208; 252/1; 257/718
(58) Field of Classification Search .................. 524/588, 524/862, 430, 786; 585/7; 508/150, 154, 508/208, 121, 123; 257/712, 718; 252/1
See application file for complete search history.

(56) References Cited

U.S. PATENT DOCUMENTS

| | | | |
|---|---|---|---|
| 5,981,641 A | 11/1999 | Takahashi et al. | |
| 6,025,435 A * | 2/2000 | Yamakawa et al. | 524/862 |
| 6,136,758 A | 10/2000 | Yamada et al. | |
| 6,306,957 B1 * | 10/2001 | Nakano et al. | 524/700 |
| 7,141,273 B2 | 11/2006 | Endo et al. | |
| 2002/0014692 A1 * | 2/2002 | Yamada et al. | 257/712 |
| 2002/0018885 A1 | 2/2002 | Takahashi et al. | |
| 2005/0110133 A1 | 5/2005 | Yamada et al. | |
| 2005/0261140 A1 * | 11/2005 | Yamada et al. | 508/150 |
| 2006/0135687 A1 | 6/2006 | Fukui | |
| 2007/0042533 A1 | 2/2007 | Endo et al. | |

FOREIGN PATENT DOCUMENTS

| | | |
|---|---|---|
| CN | 1626598 A | 6/2005 |
| EP | 0 024 498 A1 | 3/1981 |
| EP | 0 382 188 A1 | 8/1990 |
| EP | 1 600 494 A1 | 11/2005 |
| EP | 1 754 772 A1 | 2/2007 |
| GB | 1 480 931 | 7/1977 |
| JP | 52-33272 | 8/1977 |
| JP | 61-157587 | 7/1986 |
| JP | 2-153995 | 6/1990 |
| JP | 4-13767 | 1/1992 |
| JP | 11-49958 | 2/1999 |
| JP | 2000-256558 | 9/2000 |
| JP | 2002-3718 | 1/2002 |
| JP | 2002-30217 | 1/2002 |
| JP | 2002-129019 | 5/2002 |
| JP | 2004-210856 * | 7/2004 |
| JP | 2004-262972 | 9/2004 |
| JP | 2005-112961 | 4/2005 |
| JP | 2005-154532 | 6/2005 |
| JP | 2005-162975 | 6/2005 |
| JP | 2007-51227 | 3/2007 |
| WO | WO 02/092693 A1 | 11/2002 |

OTHER PUBLICATIONS

U.S. Appl. No. 11/776,124, filed Jul. 11, 2007, Endo, et al.
Office Action issued Feb. 18, 2011, in European Patent Application No. 06 256 248.3.
Office Action issued Aug. 3, 2010, in Japanese Patent Application No. 2005-374486.

* cited by examiner

*Primary Examiner* — James J Seidleck
*Assistant Examiner* — S. Camilla Pourbohloul
(74) *Attorney, Agent, or Firm* — Oblon, Spivak, McClelland, Maier & Neustadt, L.L.P.

(57) ABSTRACT

Provided is a heat conductive silicone grease composition, including: (A) 100 parts by volume of an organopolysiloxane with a specific structure and with a kinematic viscosity at 25° C. of 10 to 10,000 $mm^2/s$, (B) 0.1 to 50 parts by volume of an alkoxysilane with a specific structure, and (C) 100 to 2,500 parts by volume of a heat conductive filler. The composition exhibits high thermal conductivity, retains excellent fluidity meaning the composition exhibits favorable workability, and is capable of filling fine indentations, thereby reducing contact resistance and providing excellent heat radiation performance. Also, the durability, under conditions of high temperature and high humidity, of the composition is improved, thereby improving the reliability of the composition during actual use. Heat generated by a heat-generating body can be dissipated into a heat-radiating body by sandwiching the composition between the heat-generating body and the heat-radiating body.

8 Claims, No Drawings ize range into a specific organopolysiloxane. Patent reference 6 discloses a heat conductive silicone grease that uses a combination of a fine aluminum nitride powder with a small particle size and a coarse aluminum nitride powder with a large particle size. Patent reference 7 discloses a heat conductive silicone grease that uses a combination of an aluminum nitride powder and a zinc oxide powder. Patent reference 8 discloses a heat conductive grease composition that uses an aluminum nitride powder that has undergone surface treatment with an organosilane.

HEAT CONDUCTIVE SILICONE GREASE COMPOSITIONS

BACKGROUND OF THE INVENTION

1. Field of the Invention

The present invention relates to a heat conductive silicone grease composition which, even when filled with a large quantity of a heat conductive filler in order to provide superior thermal conductivity, still retains favorable fluidity and favorable handling properties, and also exhibits excellent durability and reliability under conditions of high temperature and high humidity.

2. Description of the Prior Art

Many electronic components generate heat during use, and in order to ensure satisfactory operation of these electronic components, the generated heat must be conducted away from the electronic components. Particularly in the case of integrated circuit elements such as the CPUs used in personal computers, the quantity of heat generated has continued to increase as the operating frequency has risen, meaning heat removal has become a significant problem.

Numerous methods have been proposed for removing this heat. Particularly in the case of electronic components that generate large quantities of heat, methods have been proposed in which the heat is dissipated by placing a heat conductive material such as a heat conductive grease or heat conductive sheet between the electronic component and another member such as a heat sink (see patent reference 1 and patent reference 2).

Known examples of this type of heat conductive material include heat-radiating greases that comprise a zinc oxide or alumina powder blended into a silicone oil base (see patent reference 3 and patent reference 4).

Moreover, in order to further improve the thermal conductivity, heat conductive materials that use aluminum nitride powder are also known. The patent reference 1 discloses a thixotropic heat conductive material that comprises a liquid organosilicone carrier, silica fiber, and one or more materials selected from amongst dendritic zinc oxide, aluminum nitride flakes, and boron nitride flakes. Patent reference 5 discloses a silicone grease composition obtained by blending a spherical hexagonal aluminum nitride powder with a specified particle size range into a specific organopolysiloxane. Patent reference 6 discloses a heat conductive silicone grease that uses a combination of a fine aluminum nitride powder with a small particle size and a coarse aluminum nitride powder with a large particle size. Patent reference 7 discloses a heat conductive silicone grease that uses a combination of an aluminum nitride powder and a zinc oxide powder. Patent reference 8 discloses a heat conductive grease composition that uses an aluminum nitride powder that has undergone surface treatment with an organosilane.

Aluminum nitride has a thermal conductivity of 70 to 270 W/(m·K), whereas diamond has an even higher thermal conductivity of 900 to 2,000 W/(m·K). Patent reference 9 discloses a heat conductive silicone composition that comprises a silicone resin, diamond, zinc oxide, and a dispersant.

Furthermore, metals also have a high thermal conductivity, and can be used in those situations where insulation of the electronic component is unnecessary. Patent reference 10 discloses a heat conductive grease composition obtained by mixing metallic aluminum powder with a base oil such as a silicone oil.

However, none of these heat conductive materials or heat conductive greases is able to satisfactorily cope with the quantity of heat generated by modern integrated circuit elements such as CPUs.

It is known from the theoretical equation of Maxwell and Bruggeman that the thermal conductivity of a material obtained by blending a heat conductive filler into a silicone oil is substantially independent of the thermal conductivity of the heat conductive filler if the volume fraction of the heat conductive filler is 0.6 or less. The thermal conductivity of the material only starts to be affected by the thermal conductivity of the heat conductive filler once the volume fraction of the filler exceeds 0.6. In other words, in order to raise the thermal conductivity of a heat conductive grease, the first important factor is to determine how to enable the grease to be filled with a large quantity of heat conductive filler. If such high-quantity filling is possible, then the next important factor is to determine how to enable the use of a filler with a high thermal conductivity. However, high-quantity filling causes a variety of problems, including a reduction in the fluidity of the heat conductive grease, and a deterioration in the workability of the grease, including the coating characteristics (such as the dispensing and screen printing characteristics), making practical application of the grease impossible. In addition, because the fluidity of the grease decreases, the grease becomes unable to fill minor indentations within the surface of the electronic component and/or heat sink, which causes an undesirable increase in the contact resistance.

With the aim of producing heat conductive materials with high-quantity filling and favorable fluidity, investigations have also been conducted into adding an alkoxy group-containing organopolysiloxane that treats the surface of the heat conductive filler, thereby causing a significant improvement in the dispersibility of the filler (see patent reference 11 and patent reference 12). However, these treatment agents degenerate via hydrolysis or the like under conditions of high temperature and high humidity, causing a deterioration in the performance of the heat conductive material.

[Patent Reference 1] EP 0 024 498 A1
[Patent Reference 2] JP 61-157587 A
[Patent Reference 3] JP 52-33272 B
[Patent Reference 4] GB 1 480 931 A
[Patent Reference 5] JP 2-153995 A
[Patent Reference 6] EP 0 382 188 A1
[Patent Reference 7] U.S. Pat. No. 5,981,641
[Patent Reference 8] U.S. Pat. No. 6,136,758
[Patent Reference 9] JP 2002-30217 A
[Patent Reference 10] US 2002/0018885 A1
[Patent Reference 11] US 2006/0135687 A1
[Patent Reference 12] JP 2005-162975 A

SUMMARY OF THE INVENTION

In order to address the problems described above, an object of the present invention is to provide a heat conductive silicone grease composition that exhibits high thermal conductivity, retains excellent fluidity meaning the composition exhibits favorable workability, and is capable of filling fine indentations, thereby reducing contact resistance and providing excellent heat radiation performance. In addition, another object of the present invention is to improve the durability, under conditions of high temperature and high humidity, of this heat conductive silicone grease composition, thereby improving the reliability of the composition during actual use.

The inventors of the present invention discovered that a heat conductive silicone grease composition comprising an organopolysiloxane with a specific structure and with a kinematic viscosity at 25° C. of 10 to 10,000 mm²/s, an alkoxysilane containing specific substituent groups, and a heat conductive filler exhibited excellent thermal conductivity and favorable fluidity, and as a result, provided an excellent heat-radiating effect. The inventors also discovered that the composition exhibited extremely favorable durability under conditions of high temperature and high humidity, and they were therefore able to complete the present invention. In other words, the present invention provides a heat conductive silicone grease composition, comprising:

(A) 100 parts by volume of an organopolysiloxane represented by formula (1) shown below:

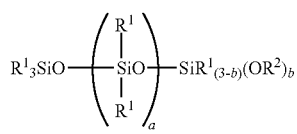

wherein, each $R^1$ represents, independently, an unsubstituted or substituted monovalent hydrocarbon group, each $R^2$ represents, independently, an alkyl group, alkoxyalkyl group, alkenyl group or acyl group, a represents an integer from 4 to 99, and b represents an integer from 1 to 3, with a kinematic viscosity at 25° C. of 10 to 10,000 mm²/s, (B) 0.1 to 50 parts by volume of an alkoxysilane represented by a general formula (2) shown below:

$$R^3{}_cR^4{}_dSi(OR^5)_{4-c-d} \quad (2)$$

(wherein, each $R^3$ represents, independently, an alkyl group of 9 to 15 carbon atoms, each $R^4$ represents, independently, an unsubstituted or substituted monovalent hydrocarbon group of 1 to 8 carbon atoms, each $R^5$ represents, independently, an alkyl group of 1 to 6 carbon atoms, c represents an integer from 1 to 3, and d represents an integer from 0 to 2, provided that c+d represents an integer from 1 to 3), and (C) 100 to 2,500 parts by volume of a heat conductive filler.

A second aspect of the present invention provides a method for dissipating heat generated by a heat-generating body into a heat-radiating body, comprising the steps of:

applying the above composition to a surface of said heat-generating body, and mounting said heat-radiating body on said applied composition to sandwich said composition between said heat-generating body and said heat-radiating body, thereby dissipating said heat into said heat-radiating body.

A heat conductive silicone grease composition of the present invention has excellent thermal conductivity, and because it retains favorable fluidity, also exhibits excellent workability. Furthermore, the composition also exhibits excellent adhesion to heat-generating electronic components and heat-radiating components. Consequently, by positioning the heat conductive silicone grease composition of the present invention between a heat-generating electronic component and a heat-radiating component, the heat generated by the heat-generating electronic component can be dissipated efficiently into the heat-radiating component. In addition, the heat conductive silicone grease composition of the present invention exhibits excellent durability under conditions of high temperature and high humidity, meaning it offers extremely favorable reliability when used for heat dissipation from general power sources or electronic equipment, or for heat dissipation from integrated circuit elements such as LSI and CPU used in all manner of electronic equipment including personal computers and digital video disc drives. Using a heat conductive silicone grease composition of the present invention enables dramatic improvements in the stability and lifespan of heat-generating electronic components and the electronic equipment that uses such components.

DETAILED DESCRIPTION OF THE PREFERRED EMBODIMENTS

A more detailed description of the present invention is presented below. In this description, quantities expressed using the units "parts by volume" and viscosity values all refer to values measured at 25° C.

[Component (A)]

The component (A) is an organopolysiloxane represented by formula (1) shown below:

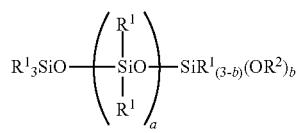

wherein, each $R^1$ represents, independently, an unsubstituted or substituted monovalent hydrocarbon group, each $R^2$ represents, independently, an alkyl group, alkoxyalkyl group, alkenyl group or acyl group, a represents an integer from 4 to 99, and b represents an integer in from 1 to 3, with a kinematic viscosity at 25° C. of 10 to 10,000 mm²/s. The component (A) maintains the fluidity of the composition of the present invention, and imparts the composition with favorable handling properties, even when the composition is filled with a large quantity of the heat conductive filler of the component (C) in order to achieve a silicone grease composition with high thermal conductivity. The component (A) may use either a single compound, or a combination of two or more different compounds.

Each $R^1$ represents, independently, an unsubstituted or substituted monovalent hydrocarbon group, and suitable examples include straight-chain alkyl groups, branched-chain alkyl groups, cyclic alkyl groups, alkenyl groups, aryl groups, aralkyl groups, and halogenated alkyl groups. Specific examples of suitable straight-chain alkyl groups include a methyl group, ethyl group, propyl group, hexyl group, or octyl group. Specific examples of suitable branched-chain alkyl groups include an isopropyl group, isobutyl group, tert-butyl group, or 2-ethylhexyl group. Specific examples of suitable cyclic alkyl groups include a cyclopentyl group or cyclohexyl group. Specific examples of suitable alkenyl groups include a vinyl group or allyl group. Specific examples of suitable aryl groups include a phenyl group or tolyl group. Specific examples of suitable aralkyl groups include a 2-phenylethyl group or 2-methyl-2-phenylethyl group. Specific examples of suitable halogenated alkyl groups include a 3,3,3-trifluoropropyl group, 2-(nonafluorobutyl)ethyl group, or 2-(heptadecafluorooctyl)ethyl group. HL is preferably a methyl group or a phenyl group.

Each $R^2$ represents, independently, an alkyl group, alkoxyalkyl group, alkenyl group or acyl group. Examples of suitable alkyl groups include the same straight-chain alkyl groups, branched-chain alkyl groups, and cyclic alkyl groups listed above in relation to $R^1$. Examples of suitable alkoxyalkyl groups include a methoxyethyl group or methoxypropyl group. Examples of suitable alkenyl groups include a vinyl group or allyl group. Examples of suitable acyl groups include an acetyl group or octanoyl group. $R^2$ is preferably an alkyl group, and a methyl group or ethyl group is particularly preferred.

a represents an integer from 5 to 100. b represents an integer from 1 to 3, and is preferably 3.

The kinematic viscosity of the component (A) at 25° C. is typically within a range from 10 to 10,000 mm²/s, and is preferably from 10 to 5,000 mm²/s. If this kinematic viscosity is lower than 10 mm²/s, then the resulting silicone grease composition tends to be more prone to oil bleeding. If the kinematic viscosity exceeds 10,000 mm²/s, then the fluidity of the resulting silicone grease composition tends to be prone to deterioration.

Specific examples of preferred compounds of the component (A) include the compounds shown below.

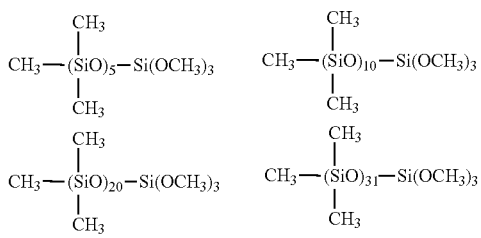

[Component (B)]

The component (B) is an alkoxysilane represented by a general formula (2) shown below.

$$R^3{}_c R^4{}_d Si(OR^5)_{4-c-d} \quad (2)$$

(wherein, each $R^3$ represents, independently, an alkyl group of 9 to 15 carbon atoms, each $R^4$ represents, independently, an unsubstituted or substituted monovalent hydrocarbon group of 1 to 8 carbon atoms, each $R^5$ represents, independently, an alkyl group of 1 to 6 carbon atoms, c represents an integer from 1 to 3, and d represents an integer from 0 to 2, provided that c+d represents an integer from 1 to 3)

The component (B) is a wetting component, and also prevents degradation of the component (A) under conditions of high temperature and high humidity. By treating the surface of the heat conductive filler of the component (C) with the component (B), the wetting characteristics between the component (A) and the component (C) can be improved. As a result, the component (B) assists in achieving high-quantity filling of the component (C). Furthermore, by using the component (B) in combination with the component (A), the component (B) is able to suppress contact between the component (A) and water vapor when the composition is used under conditions of high temperature and high humidity. As a result, the component (B) prevents degradation of the component (A) that is caused by hydrolysis under conditions of high temperature and high humidity, thereby preventing any deterioration in the performance of the heat conductive silicone grease composition of the present invention. The component (B) may use either a single compound, or a combination of two or more different compounds.

Each $R^3$, represents, independently, an alkyl group of 9 to 15 carbon atoms, and specific examples of suitable groups include a nonyl group, decyl group, dodecyl group, tetradecyl group, or pentadecyl group. If the number of carbon atoms is less than 9, then the wetting of the heat conductive filler (the component (C)) may be unsatisfactory, whereas if the number of carbon atoms exceeds 15, the component (B) becomes prone to solidification at room temperature, which not only makes the compound more difficult to handle, but also tends to reduce the thermal resistance and flame retardancy of the resulting composition.

Each $R^4$ represents, independently, an unsubstituted or substituted, saturated or unsaturated monovalent hydrocarbon group of 1 to 8 carbon atoms, and specific examples of suitable groups include alkyl groups such as a methyl group, ethyl group, propyl group, hexyl group, or octyl group; cycloalkyl groups such as a cyclopentyl group or cyclohexyl group; alkenyl groups such as a vinyl group or allyl group; aryl groups such as a phenyl group or tolyl group; aralkyl groups such as a 2-phenylethyl group or 2-methyl-2-phenylethyl group; and halogenated hydrocarbon groups such as a 3,3,3-trifluoropropyl group, 2-(nonafluorobutyl)ethyl group, 2-(heptadecafluorooctyl)ethyl group, or p-chlorophenyl group. Of these, a methyl group or ethyl group is particularly preferred.

Each $R^5$ represents, independently, an alkyl group of 1 to 6 carbon atoms, and specific examples of suitable groups include a methyl group, ethyl group, propyl group, butyl group, pentyl group, or hexyl group. A methyl group or ethyl group is particularly preferred.

c typically represents an integer from 1 to 3, but is most preferably 1. d represents an integer from 0 to 2. The value of c+d is an integer from 1 to 3.

Specific examples of the component (B) include the compounds shown below.

$C_{10}H_{21}Si(OCH_3)_3$
$C_{12}H_{25}Si(OCH_3)_3$
$C_{12}H_{25}Si(OC_2H_5)_3$
$C_{10}H_{21}Si(CH_3)(OCH_3)_2$
$C_{10}H_{21}Si(C_6H_5)(OCH_3)_2$
$C_{10}H_{21}Si(CH_3)(OC_2H_5)_2$
$C_{10}H_{21}Si(CH=CH_2)(OCH_3)_2$
$C_{10}H_{21}Si(CH_2CH_2CF_3)(OCH_3)_2$

The quantity added of the component (B) is typically within a range from 0.1 to 50 parts by volume, and preferably from 1 to 20 parts by volume, per 100 parts by volume of the component (A). If the quantity added falls within this range, then the wetting effect and the resistance to high temperature and high humidity can be easily increased by increasing the addition quantity, which ensures good economic viability. On the other hand, because the component (B) is slightly volatile, if a heat conductive silicone grease composition comprising the component (B) is left standing in an open system, then the component (B) may evaporate, causing the composition to gradually harden. However, if the addition quantity is kept within the above range, this type of hardening phenomenon can be more readily prevented.

[Component (C)]

The component (C) functions as a heat conductive filler within a heat conductive silicone grease composition of the present invention. The component (C) may use either a single compound, or a combination of two or more different compounds.

The average particle size of the component (C) is preferably within a range from 0.1 to 50 μm, and is even more preferably from 1 to 35 μm. Provided the average particle size falls within this range, the bulk density of the component (C) can be easily increased, and the specific surface area can be easily reduced, meaning high-quantity filling of the component (C) within the heat conductive silicone grease composition of the present invention can be achieved more easily. If the average particle size is too large, then oil separation may proceed more readily. In the present invention, the average particle size can be determined, for example, by using a laser diffraction method or the like to determine a volume-based cumulative average particle size.

There are no particular restrictions on the shape of the particles of the component (C), and spherical, rod-shaped, needle-like, disc-shaped, and irregularly shaped particles are all suitable.

Specific examples of the component (C) include aluminum, silver, copper, nickel, zinc oxide, alumina, magnesium oxide, aluminum nitride, boron nitride, silicon nitride, diamond, graphite, carbon nanotubes, metallic silicon, carbon fiber, fullerene, or combinations of two or more of these materials.

The quantity added of the component (C) is typically within a range from 100 to 2,500 parts by volume, and is preferably from 150 to 1,000 parts by volume, per 100 parts by volume of the component (A). If this addition quantity is less than 100 parts by volume, then the thermal conductivity of the resulting heat-radiating member tends to decrease. In contrast, if the total quantity added exceeds 2,500 parts by volume, then the viscosity of the resulting composition tends to become overly high, making the fluidity and handling characteristics of the composition unsatisfactory.

[Component (D)]

A composition of the present invention may also include, as a component (D), an organopolysiloxane represented by an average composition formula (3) shown below:

(wherein, each $R^6$ represents, independently, an unsubstituted or substituted monovalent hydrocarbon group of 1 to 18 carbon atoms, and e represents a number from 1.8 to 2.2), with a kinematic viscosity at 25° C. of 10 to 100,000 mm²/s. The component (D) can be used for imparting certain desired properties to the heat conductive silicone grease composition of the present invention, and can function as a viscosity-regulating agent or an adhesion-imparting agent or the like, although the component (D) is not limited to such uses. The component (D) may use either a single compound, or a combination of two or more different compounds.

Each $R^6$ represents, independently, an unsubstituted or substituted monovalent hydrocarbon group of 1 to 18 carbon atoms. Specific examples of suitable groups include alkyl groups such as a methyl group, ethyl group, propyl group, hexyl group, octyl group, decyl group, dodecyl group, tetradecyl group, hexadecyl group, or octadecyl group; cycloalkyl groups such as a cyclopentyl group or cyclohexyl group; alkenyl groups such as a vinyl group or allyl group; aryl groups such as a phenyl group or tolyl group; aralkyl groups such as a 2-phenylethyl group or 2-methyl-2-phenyl-ethyl group; and halogenated hydrocarbon groups such as a 3,3,3-trifluoropropyl group, 2-(perfluorobutyl)ethyl group, 2-(perfluorooctyl)ethyl group, or p-chlorophenyl group. Of these, a methyl group, phenyl group, or alkyl group of 6 to 18 carbon atoms is particularly preferred.

From the viewpoint of ensuring that the composition of the present invention has the consistency required to function as a silicone grease composition, e preferably represents a number within a range from 1.8 to 2.2, and is even more preferably a number from 1.9 to 2.1.

Furthermore, the kinematic viscosity of the component (D) at 25° C. is typically from 10 to 100,000 mm²/s, and is preferably from 10 to 10,000 mm²/s. If this kinematic viscosity is lower than 10 mm²/s, then the resulting silicone grease composition tends to be more prone to oil bleeding. If the kinematic viscosity exceeds 100,000 mm²/s, then the fluidity of the resulting silicone grease composition tends to deteriorate.

Specific examples of the component (D) include the compounds shown below.

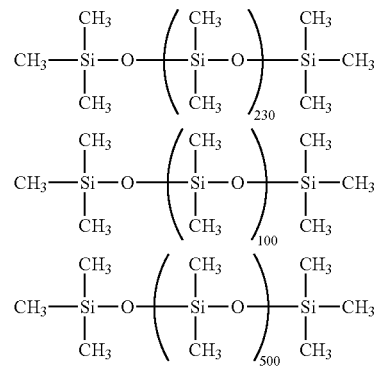

When a component (D) is added to a composition of the present invention, there are no particular restrictions on the quantity added, and any quantity that yields the desired effect is suitable, although the quantity added is preferably not more than 500 parts by volume, and is even more preferably 200 parts by volume or less, per 100 parts by volume of the component (A). If the addition quantity is within this range, then the extremely favorable fluidity and workability of the composition of the present invention can be more easily maintained, and a large quantity of the heat conductive filler of the component (C) can be more easily included within the composition.

[Component (E)]

A composition of the present invention may also include, as a component (E), a volatile solvent capable of dissolving or dispersing the components (A) and (B). If the composition of the present invention includes a component (D) in addition to the components (A) and (B), then the use of a volatile solvent that is also capable of dissolving or dispersing the component (D) is preferred. The component (E) may be any solvent that is capable of dissolving or dispersing the components (A) and (B), and where required the component (D). The component (E) may use either a single solvent, or a combination of two or more different solvents.

Because the thermal conductivity of the heat conductive silicone grease composition correlates basically with the fill factor of the heat conductive filler, the thermal conductivity increases as the quantity of the heat conductive filler included in the composition is increased. However, as the fill quantity of the heat conductive filler is increased, the viscosity of the heat conductive silicone grease composition tends to increase, and the dilatancy of the composition when a shearing action is applied also tends to strengthen. Particularly in the case of screen printing, if dilatancy manifests strongly during squeegee application of the heat conductive silicone grease composition, then the fluidity of the heat conductive silicone grease composition is temporarily inhibited quite powerfully, meaning the heat conductive silicone grease composition may be unable to pass through the screen mask or screen mesh, causing a deterioration in the coating characteristics at the edges of the mask or mesh. For this reason, conventionally, using a screen printing method to apply a uniform thin coating of a highly heat conductive silicone grease composition containing a large fill quantity of a heat conductive filler to a heat sink or the like has been difficult. In the case of a heat conductive silicone grease composition of the present invention, even when the heat conductive filler of the component (C) is included at a very high fill factor, if a volatile solvent of the component (E) is included in the composition, then the viscosity can be drastically reduced, meaning dilatancy is far less likely to occur. As a result, the coating characteristics tend to improve, and application of the composition to a heat sink or the like can be conducted easily using screen printing. Following application, the component (E) can be easily removed by evaporation, either at room temperature, or by heating. Accordingly, by using the present invention, a uniform thin coating of a highly heat conductive silicone grease composition containing a large fill quantity of a heat conductive filler can be easily applied to a heat sink or the like by screen printing.

The boiling point of the component (E) is preferably within a range from 80 to 260° C. If the boiling point is within this range, then the danger of the component (E) evaporating rapidly from the composition during the coating operation can be prevented, meaning increases in the viscosity of the composition can be easily suppressed, and the coating characteristics of the composition can be satisfactorily maintained. Furthermore, the component (E) is unlikely to remain within the composition following the coating operation, meaning the heat-radiating properties of the applied coating can be improved.

Specific examples of the component (E) include toluene, xylene, acetone, methyl ethyl ketone, cyclohexanone, n-hexane, n-heptane, butanol, isopropanol (IPA), and isoparaffin-based solvents. Of these, from the viewpoints of safety, health, and workability, isoparaffin-based solvents are preferred, and isoparaffin-based solvents with a boiling point of 80 to 260° C. are particularly desirable.

In those cases where a component (E) is added to a composition of the present invention, the quantity added is preferably not more than 100 parts by volume, and even more preferably 75 parts by volume or less, per 100 parts by volume of the component (A). If this addition quantity is within this range, then the component (C) can be prevented from undergoing rapid sedimentation, meaning the storage stability of the composition can be improved.

[Other Additives]

Typically used additives or fillers may also be added, as optional components, to a heat conductive silicone grease composition of the present invention, provided the addition of these optional components does not impair the purpose of the present invention. Specific examples of these optional components include fluorine-modified silicone surfactants; colorants such as carbon black, titanium dioxide, and red iron oxide; flame retardancy-imparting agents such as platinum catalysts, metal oxides such as iron oxide, titanium oxide and cerium oxide, and metal hydroxides. Moreover, in order to prevent sedimentation of the heat conductive filler under high temperature conditions, a finely powdered silica such as a precipitated silica or calcined silica, or a thixotropic improvement agent or the like may also be added.

[Viscosity]

The viscosity at 25° C. of a heat conductive silicone grease composition of the present invention is preferably not higher than 500 Pa·s (from 1 to 500 Pa·s), and is even more preferably 300 Pa·s or less (10 to 300 Pa·s). If the viscosity is within this range, then the composition tends to have more favorable fluidity, which improves the workability properties such as the dispensing and screen printing characteristics, and makes it easier to apply a thin coating of the composition to a substrate.

[Thermal Resistance]

Furthermore, the thermal resistance at 25° C. of a heat conductive silicone grease composition of the present invention, measured using a laser flash method, is preferably not more than 15 mm$^2$·K/W, and is even more preferably 6 mm$^2$·K/W or less. If the thermal resistance is within this range, then the composition of the present invention is able to efficiently dissipate the heat generated by a heat-generating body into a heat-radiating component, even in those cases where the heat-generating body has a large heat value. Measurement of the thermal resistance using a laser flash method can be conducted in accordance with ASTME 1461.

[Composition Preparation]

A heat conductive silicone grease composition of the present invention can be prepared by mixing together the above components using a mixing device such as a dough mixer (kneader), a gate mixer, or a planetary mixer. A composition prepared in this manner exhibits a dramatically improved thermal conductivity, and favorable levels of workability, durability, and reliability.

[Applications for the Composition]

A heat conductive silicone grease composition of the present invention is applied to heat-generating bodies and/or heat-radiating bodies. Examples of suitable heat-generating bodies include general power sources; electronic equipment such as power transistors for power sources, power modules, thermistors, thermocouples, and temperature sensors; and heat-generating electronic components including integrated circuits such as LSI and CPU. Examples of suitable heat-radiating bodies include heat-radiating components such as heat spreaders and heat sinks; and heat-radiating plates such as heat pipes. Application of the composition may be conducted by screen printing. Screen printing may be conducted using a metal mask or a screen mesh or the like. By applying a coating of a composition of the present invention between a heat-generating body and a heat-radiating body, heat can be transmitted efficiently from the heat-generating body into the heat-radiating body, meaning the heat can be effectively dissipated away from the heat-generating body.

EXAMPLES

As follows is a more detailed description of the present invention using a series of examples and comparative examples, although the present invention is in no way limited by these examples.

First, the following components required for forming compositions of the present invention were prepared.

(A) Organopolysiloxane Containing Alkoxy Groups Bonded to a Silicon Atom

A-1: An organopolysiloxane represented by a formula shown below.

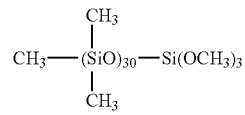

(B) Alkoxysilane

B-1: An alkoxysilane represented by the formula below.

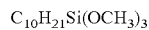

B-2: An alkoxysilane represented by the formula below.

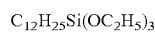

(C) Heat Conductive Filler

C-1: Aluminum powder (average particle size: 32.6 μm, fraction that passed through a mesh size of 75 μm prescribed in JIS Z 8801-1)

C-2: Aluminum powder (average particle size: 15.0 μm, the fraction that passed through a mesh size of 32 μm prescribed in JIS Z 8801-1)
C-3: Copper powder (average particle size: 10.1 μm, an air stream-classified product)
C-4: Alumina powder (average particle size: 10.0 μm, the fraction that passed through a mesh size of 32 μm prescribed in JIS Z 8801-1)
C-5: Aluminum powder (average particle size: 1.5 μm, the fraction that passed through a mesh size of 32 μm prescribed in JIS Z 8801-1)
C-6: Zinc oxide powder (average particle size: 1.0 μm, the fraction that passed through a mesh size of 32 μm prescribed in JIS Z 8801-1)
C-7: Copper powder (average particle size: 108.3 μm, unclassified)

The average particle size values listed above for the various components (C) represent volume-based cumulative average particle size values measured using a particle size analyzer (Microtrac MT3300EX, manufactured by Nikkiso Co., Ltd.).
(D) Organopolysiloxane
D-1: An organopolysiloxane with a kinematic viscosity of 500 mm$^2$/s, represented by a formula shown below.

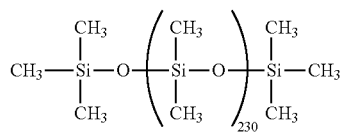

(E) Volatile Solvent Capable of Dissolving or Dispersing the Components A-1, B-2, and D-1
E-1: ISOSOL (a registered trademark)-400 (a product name for an isoparaffin-based solvent with a boiling point of 210 to 254° C., manufactured by Nippon Petrochemicals Co., Ltd.).

[Method of Production]

The components (A) through (E) were mixed together in the ratios shown below, thereby forming compositions of examples 1 through 5, and comparative examples 1 through 5. In other words, the components (A) through (D) were combined in a 5 liter planetary mixer (manufactured by Inoue Manufacturing Co., Ltd.) using the ratios (parts by volume) shown in Table 1 and Table 2, and the resulting mixture was mixed for one hour at 70° C. The mixture was then cooled to room temperature. In those cases where a component (E) needed to be added, this component (E) was added to the cooled mixture using the blend quantity shown in Table 1 or Table 2, and was then mixed to generate a uniform mixture.

[Test Methods]

The properties of the prepared compositions were measured using the test methods described below. The results are shown in Table 1 and Table 2.

[Measurement of Viscosity]

Each of the prepared compositions was allowed to stand for 24 hours in a constant-temperature chamber at 25° C., and the viscosity was then measured at a rotational velocity of 10 rpm using a viscometer (product name: Spiral Viscometer PC-1TL, manufactured by Malcom Co., Ltd.).

[Measurement of Thermal Conductivity]

Each of the prepared compositions was poured into a mold with a thickness of 3 cm, a kitchen wrap was used to cover the composition, and the thermal conductivity of the composition was then measured using a thermal conductivity meter (product name: Q™-500) manufactured by Kyoto Electronics Manufacturing Co., Ltd.

[Test Piece Preparation]

A layer of the silicone grease composition with a thickness of 75 μm was sandwiched between two circular aluminum plates of diameter 12.6 mm and thickness 1 mm, and the test piece was completed by applying a pressure of 0.15 MPa at 25° C. for a period of 60 minutes.

[Measurement of Thickness]

The thickness of each test piece was measured using a micrometer (manufactured by Mitsuyo Co., Ltd.), and the thickness of the composition layer was then calculated by subtracting the known thickness of the two aluminum plates.

[Measurement of Thermal Resistance]

For each of the test pieces described above, the thermal resistance (units: mm$^2$·K/W) of the composition was measured at 25° C., using a thermal resistance measurement device that employed a laser flash method (LFA447 NanoFlash, a xenon flash analyzer manufactured by Netzch Group).

[Measurement of Thermal Resistance after standing under conditions of High Temperature and High Humidity]

Following the above measurement of the thermal resistance, each test piece was left to stand for 96 hours in an atmosphere at 130° C./85% R$^H$, and the thermal resistance (units: mm$^2$·K/W) of the composition was then re-measured using the same thermal resistance measurement device as above.

TABLE 1

| | Name of Component | | 1 | 2 | 3 | 4 | 5 |
|---|---|---|---|---|---|---|---|
| Composition Ratio (parts by volume) | Component (A) | A-1 | 100.0 | 100.0 | 100.0 | 100.0 | 100.0 |
| | Component (B) | B-1 | 7.8 | 7.8 | — | 9.1 | — |
| | | B-2 | — | — | 7.5 | — | 12.4 |
| | Component (C) | C-1 | 208.8 | — | — | — | — |
| | | C-2 | — | 208.8 | 209.0 | — | — |
| | | C-3 | — | — | — | — | 426.5 |
| | | C-4 | — | — | — | 424.2 | — |
| | | C-5 | 139.2 | 139.2 | 139.0 | — | 183.5 |
| | | C-6 | 34.3 | 34.3 | 34.5 | 60.6 | 60.3 |
| | Component (D) | D-1 | — | — | — | 12.1 | 24.8 |
| | Component (E) | E-1 | — | — | 10.0 | — | 19.0 |
| Viscosity (Pa·s) | | | 49 | 64 | 89 | 184 | 103 |
| Thermal conductivity (W/(m·K)) | | | 6.8 | 5.9 | 5.1 | 4.4 | 6.2 |
| Thermal conductivity after evaporation of component (E) (W/(m·K)) | | | — | — | 6.5 | — | 7.2 |
| Thickness (μm) | | | 68 | 28 | 30 | 37 | 21 |
| Thermal resistance (mm$^2$·K/W) | | | 11.8 | 5.4 | 5.0 | 10.5 | 3.1 |
| Thermal resistance after standing under high temperature and high humidity (mm$^2$·K/W) | | | 13.0 | 6.4 | 6.1 | 12.0 | 4.3 |

TABLE 2

| | Name of Component | | 1 | 2 | 3 | 4 | 5 |
|---|---|---|---|---|---|---|---|
| Composition Ratio (parts by volume) | Component (A) | A-1 | 100.0 | 100.0 | 100.0 | 100.0 | 100.0 |
| | Component (B) | B-1 | 33.3 | — | 160.0 | — | — |
| | | B-2 | — | 9.9 | — | — | — |
| | Component (C) | C-1 | — | — | — | 193.6 | — |
| | | C-2 | 3003.3 | — | 4260.0 | — | — |
| | | C-3 | — | — | — | — | 409.5 |
| | | C-5 | 96.7 | 147.0 | 2840.0 | 129.1 | — |
| | | C-6 | 100.0 | 48.3 | 700.0 | 31.8 | 176.2 |
| | | C-7 | — | 341.7 | — | — | 57.9 |
| | Component (D) | D-1 | — | — | 1940.0 | — | 31.8 |
| | Component (E) | E-1 | — | 15.2 | — | — | 18.3 |
| Viscosity (Pa·s) | | | —*1) | —*2) | 583 | 136 | 188 |

TABLE 2-continued

|  | Comparative Example | | | | |
|---|---|---|---|---|---|
| Name of Component | 1 | 2 | 3 | 4 | 5 |
| Thermal conductivity (W/(m · K)) | —[1)] | —[2)] | 5.6 | 6.6 | 6.0 |
| Thermal conductivity after evaporation of component (E) (W/(m · K)) | —[1)] | —[2)] | — | — | 7.0 |
| Thickness (μm) | —[1)] | —[2)] | 38 | 74 | 23 |
| Thermal resistance (mm² · K/W) | —[1)] | —[2)] | 8.2 | 13.9 | 4.1 |
| Thermal resistance after standing under high temperature and high humidity (mm² · K/W) | —[1)] | —[2)] | 8.7 | 24.0 | 18.6 |

[*1)] The composition of the comparative example 1 could not be converted to paste form, even when mixed using a mixer.
[*2)] The composition of the comparative example 2 underwent oil separation, and exhibited poor storage stability.

What is claimed is:

1. A heat conductive silicone grease composition, consisting essentially of:
(A) 100 parts by volume of an organopolysiloxane represented by formula (1):

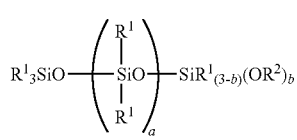

(1)

wherein,
each $R^1$ represents, independently, an unsubstituted or substituted monovalent hydrocarbon group,
each $R^2$ represents, independently, an alkyl group, alkoxyalkyl group, alkenyl group or acyl group,
a represents an integer from 4 to 99, and
b represents an integer from 1 to 3,
with a kinematic viscosity at 25° C. of 10 to 10,000 mm²/s,
(B) 0.1 to 50 parts by volume of an alkoxysilane represented by formula (2):

(2)

wherein,
each $R^3$ represents, independently, an alkyl group of 9 to 15 carbon atoms,
each $R^4$ represents, independently, an unsubstituted or substituted monovalent hydrocarbon group of 1 to 8 carbon atoms,
each $R^5$ represents, independently, an alkyl group of 1 to 6 carbon atoms,
c represents an integer from 1 to 3, and
d represents an integer from 0 to 2,
provided that c+d represents an integer from 1 to 3,
(C) 100 to 2,500 parts by volume of a heat conductive filler, and
(D) an organopolysiloxane represented by an average composition formula (3):

(3)

wherein,
each $R^6$ represents, independently, an unsubstituted or substituted monovalent hydrocarbon group of 1 to 18 carbon atoms, and
e represents a number from 1.8 to 2.2,
with a kinematic viscosity at 25° C. of 10 to 100,000 mm²/s,
wherein said component (D) is present in an amount of not more than 500 parts by volume per one hundred parts by volume of component (A).

2. The composition according to claim 1, wherein said component (D) is present in an amount of from 24.8 to 500 parts by volume per one hundred parts by volume of component (A).

3. The composition according to claim 1, wherein said component (D) is present in an amount of from 200 to 500 parts by volume per one hundred parts by volume of component (A).

4. The composition according to claim 1, wherein said component (C) consists of alumina powder having an average particle size of from 10.0 to 50 μm.

5. The composition according to claim 1, wherein said component (C) consists of zinc oxide powder having an average particle size of from 1.0 to 50 μm.

6. A heat conductive silicone grease composition, consisting essentially of:
(A) 100 parts by volume of an organopolysiloxane represented by formula (1):

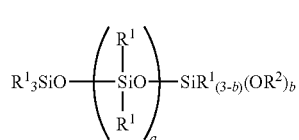

(1)

wherein,
each $R^1$ represents, independently, an unsubstituted or substituted monovalent hydrocarbon group,
each $R^2$ represents, independently, an alkyl group, alkoxyalkyl group, alkenyl group or acyl group,
a represents an integer from 4 to 99, and
b represents an integer from 1 to 3,
with a kinematic viscosity at 25° C. of 10 to 10,000 mm²/s,
(B) 0.1 to 50 parts by volume of an alkoxysilane represented by formula (2):

(2)

wherein,
each $R^3$ represents, independently, an alkyl group of 9 to 15 carbon atoms,
each $R^4$ represents, independently, an unsubstituted or substituted monovalent hydrocarbon group of 1 to 8 carbon atoms,
each $R^5$ represents, independently, an alkyl group of 1 to 6 carbon atoms,
c represents an integer from 1 to 3, and
d represents an integer from 0 to 2,
provided that c+d represents an integer from 1 to 3,
(C) 100 to 2,500 parts by volume of a heat conductive filler,
(D) an organopolysiloxane represented by an average composition formula (3):

(3)

wherein,
each $R^6$ represents, independently, an unsubstituted or substituted monovalent hydrocarbon group of 1 to 18 carbon atoms, and
e represents a number from 1.8 to 2.2,
with a kinematic viscosity at 25° C. of 10 to 100,000 mm²/s, and (E) a volatile solvent capable of dissolving or dispersing said components (A) and (B), in a quantity not greater than 100 parts by volume per 100 parts by volume of said component (A), wherein said component (E) is capable of dissolving or dispersing said components (A), (B), and (D), wherein said component (D) is present in an amount of not more than 500 parts by volume per one hundred parts by volume of component (A).

7. The composition according to claim 6, wherein said component (D) is present in an amount of from 24.8 to 500 parts by volume per one hundred parts by volume of component (A).

8. The composition according to claim 6, wherein said component (D) is present in an amount of from 200 to 500 parts by volume per one hundred parts by volume of component (A).

* * * * *